(12) United States Patent
Weiss (10) Patent No.: US 10,153,400 B2
(45) Date of Patent: Dec. 11, 2018

(54) OPTOELECTRONIC SEMICONDUCTOR DEVICE, METHOD OF PRODUCING AN ELECTRICAL CONTACT AND METHOD OF PRODUCING A SEMICONDUCTOR DEVICE

(71) Applicant: OSRAM Opto Semiconductors GmbH, Regensburg (DE)

(72) Inventor: Guido Weiss, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/553,415

(22) PCT Filed: Feb. 17, 2016

(86) PCT No.: PCT/EP2016/053376
§ 371 (c)(1),
(2) Date: Aug. 24, 2017

(87) PCT Pub. No.: WO2016/135024
PCT Pub. Date: Sep. 1, 2016

(65) Prior Publication Data
US 2018/0130925 A1    May 10, 2018

(30) Foreign Application Priority Data

Feb. 27, 2015  (DE) .................. 10 2015 102 857

(51) Int. Cl.
*H01L 33/38*  (2010.01)
*H01L 33/14*  (2010.01)
(Continued)

(52) U.S. Cl.
CPC .............. *H01L 33/38* (2013.01); *H01L 33/14* (2013.01); *H01L 33/22* (2013.01); *H01L 33/42* (2013.01)

(58) Field of Classification Search
None
See application file for complete search history.

(56) References Cited

U.S. PATENT DOCUMENTS 6,417,525 B1    7/2002  Hata
2007/0114546 A1*  5/2007  Erchak .................... H01L 33/10
257/95
(Continued)

FOREIGN PATENT DOCUMENTS

CN          102800777        2/2015
DE     10 2007 032 555        1/2009
(Continued)

*Primary Examiner* — Bradley K Smith
(74) *Attorney, Agent, or Firm* — DLA Piper LLP (US)

(57) ABSTRACT

An optoelectronic semiconductor device includes a semiconductor body having a semiconductor region and an active region, wherein the semiconductor region has a covering layer forming a radiation passage surface of the semiconductor body on a side facing away from the active region, the semiconductor region has a current-spreading layer arranged between the covering layer and the active region; the semiconductor device has a contact for the electrical contacting of the semiconductor region; the contact adjoins the current-spreading layer in a terminal area; the contact adjoins the covering layer in a barrier region; and the barrier region runs parallel to the active region and is arranged closer to the active region than the radiation passage surface.

5 Claims, 8 Drawing Sheets

(51) Int. Cl.
*H01L 33/22* (2010.01)
*H01L 33/42* (2010.01)

(56) References Cited

U.S. PATENT DOCUMENTS

| | | |
|---|---|---|
| 2008/0308833 A1 | 12/2008 | Moriyama et al. |
| 2009/0045426 A1 | 2/2009 | Fehrer et al. |
| 2009/0065900 A1 | 3/2009 | Saito et al. |
| 2010/0015742 A1 | 1/2010 | Fang et al. |
| 2014/0021507 A1* | 1/2014 | Engl .................... H01L 33/405 257/99 |
| 2017/0324000 A1* | 11/2017 | Engl .................. H01L 33/0075 |

FOREIGN PATENT DOCUMENTS

| | | |
|---|---|---|
| JP | 2006-294907 | 10/2006 |
| WO | 2012/013523 | 2/2012 |

* cited by examiner

OPTOELECTRONIC SEMICONDUCTOR DEVICE, METHOD OF PRODUCING AN ELECTRICAL CONTACT AND METHOD OF PRODUCING A SEMICONDUCTOR DEVICE

TECHNICAL FIELD

This disclosure relates to an optoelectronic semiconductor device, a method of producing an electrical contact for a semiconductor region and a method of producing a semiconductor device with such a contact.

BACKGROUND

For the electrical connection of semiconductor layers and in particular for lateral current spreading, current-spreading layers, which are contacted electrically by a contact, are often used in semiconductor devices such as light-emitting diodes, for example. However, in current-spreading layers, which are located comparatively close to an active region provided to generate radiation, for example, the danger exists of the active region becoming damaged when producing the contact. This can lead to the failure of the semiconductor device.

It could therefore be helpful to provide an optoelectronic semiconductor device characterized by good electrical contactability and at the same time good optoelectronic properties, along with a method with which an electrical contact to a semiconductor device can be produced in a simple and reliable manner.

SUMMARY

I provide an optoelectronic semiconductor device including a semiconductor body having a semiconductor region and an active region, wherein the semiconductor region has a covering layer forming a radiation passage surface of the semiconductor body on a side facing away from the active region, the semiconductor region has a current-spreading layer arranged between the covering layer and the active region; the semiconductor device has a contact for the electrical contacting of the semiconductor region; the contact adjoins the current-spreading layer in a terminal area; the contact adjoins the covering layer in a barrier region; and the barrier region runs parallel to the active region and is arranged closer to the active region than the radiation passage surface.

I also provide method of producing an electrical contact for a semiconductor region including: a) providing of a semiconductor region; b) removing material of the semiconductor region in a first removal step and removal of material of the semiconductor region in a second removal step, wherein in a first area of the semiconductor region, material of the semiconductor region is removed both in the first removal step and in the second removal step and in a second area of the semiconductor region, material of the semiconductor region is removed only in the first removal step or only in the second removal step; and c) applying a contact to the first area and the second area.

I yet further provide a method of producing an optoelectronic semiconductor device with a contact.

DETAILED DESCRIPTION

My optoelectronic semiconductor device may have a semiconductor body with a semiconductor region and an active region. For example, the active region is arranged between the semiconductor region and a further semiconductor region, wherein the semiconductor region and the further semiconductor region are different from one another at least in places with regard to the conductor type so that the active region is located in a pn-junction.

The active region is provided, for example, to generate radiation and/or receive radiation. The radiation can lie in the ultraviolet, visible or infrared spectral range, for example.

The semiconductor region may have a covering layer forming a radiation passage surface of the semiconductor body on a side facing away from the active region. The covering layer thus completes the semiconductor region on the side of the semiconductor body facing away from the active region. In other words, no further semiconductor layer is located on the side of the covering layer facing away from the active region.

The semiconductor region may have a current-spreading layer. The current-spreading layer is arranged between the covering layer and the active region. In particular, the current-spreading layer and the covering layer adjoin one another. The current-spreading layer can adjoin the active region or be formed at a distance from the active region. The covering layer and/or the current-spreading layer can be formed in one layer or also in multiple layers.

The semiconductor device may have a contact for the electrical contacting of the semiconductor region. The semiconductor device expediently has a further contact for the electrical contacting of the further semiconductor region so that by applying an external electrical voltage between the contact and the further contact, charge carriers from opposite sides can get into the active region and recombine there, emitting radiation. In a radiation receiver, charge carriers generated in the active region can flow out of the semiconductor device via the contact or the further contact.

The contact may adjoin the current-spreading layer in a terminal area. The terminal area is thus a sub-region of the contact, via which an electrical contact to the current-spreading layer is produced. In other words, the terminal area forms an interface with the current-spreading layer and runs, in particular, parallel to a main extension plane of the active region.

The contact may adjoin the covering layer in a barrier region. The barrier region runs in particular parallel to the active region. For example, the barrier region is arranged closer to the active region than the radiation passage surface.

In particular, the terminal area and the barrier region are sub-areas of a continuous contact that run respectively on the side facing the active region. For example, the contact on the side of the contact opposite the barrier region has a contact surface provided for the external electrical contacting of the contact, for example, by a wire bond. The contact surface is so large, for example, that an end of a wire bond can be placed completely within the contact surface.

The semiconductor device may have a semiconductor body with a semiconductor region and an active region. The semiconductor region has a covering layer forming a radiation passage surface of the semiconductor body on a side facing away from the active region. The semiconductor region has a current-spreading layer arranged between the covering layer and the active region. The semiconductor device has a contact for electrical contact of the semiconductor region, wherein the contact adjoins the current-spreading layer in a terminal area. The contact adjoins the covering layer in a barrier region. The barrier region runs parallel to the active region and is arranged closer to the active region than the radiation passage surface.

On the side facing the semiconductor region, the contact thus has two sub-regions, wherein only the terminal area adjoins the current-spreading layer. The charge carrier injection into the semiconductor region thus takes place mainly via the terminal area. On the other hand, a charge carrier injection does not take place via the barrier region, or at least only to a reduced extent compared to the injection via the terminal area.

A direct charge carrier injection in a vertical direction underneath the contact surface can be avoided by this. "Vertical direction" means a direction that runs perpendicular to a main extension plane of the active region. The proportion of the radiation generated underneath the contact in the active region and absorbed at the contact is reduced.

The radiation passage surface may have patterning in areas and the terminal area may be flat. The patterning is provided in particular for improved radiation outcoupling and coupling of radiation into the semiconductor device. For example, the patterning is formed irregularly, for instance, by randomly arranged pyramid stubs that can have different lateral extensions. Alternatively, the patterning is formed regularly.

The terminal area is in particular flat compared to the area of the radiation passage surface having the patterning. For example, a mean squared roughness (RMS roughness) of the terminal area is at least ten times smaller than a mean squared roughness of the radiation passage surface in the area of the patterning.

The flatter the terminal area, the higher the reflectivity of the contact in the terminal area may be. Radiation absorption losses can be reduced. Furthermore, the risk of the active region becoming damaged when forming the terminal area is reduced.

The doping concentration of the current-spreading layer may be at least ten times as high as the doping concentration of the covering layer. Due to the comparatively high doping concentration of the current-spreading layer, a charge carrier injection that is homogeneous in a lateral direction can be achieved into the active region in a simplified manner. It is further achievable in a simplified manner by means of the comparatively low doping concentration of the covering layer that the electrical contacting of the semiconductor region takes place almost exclusively via the terminal area and not, or at least only to a sharply reduced extent, via the barrier region.

The current-spreading layer may be spaced at a distance of at most 100 nm from the active region. The current-spreading layer can in particular also directly adjoin the active region. The current-spreading layer is thus located particularly close to the active region. The current-spreading layer is electrically contactable from the radiation passage surface in a reliable manner by the terminal area adjoining the current-spreading layer.

A surface of the barrier region may be at least twice as large as a surface of the terminal area. The surface of the barrier region can even be at least five times or at least ten times as large as the surface of the terminal area. Due to a terminal area that is small compared to the barrier region, it can be achieved in a simplified manner that only a comparatively small proportion of charge carriers is generated underneath the contact in the active region and then absorbed at the contact.

A method of producing an electrical contact has, according to at least one example, a step in which a semiconductor region is provided. For example, the semiconductor region is arranged on an active region.

The method may comprise a step in which material of the semiconductor region is removed in a first removal step and material of the semiconductor region is removed in a second removal step, wherein in a first area of the semiconductor region, material of the semiconductor region is removed both in the first removal step and in the second removal step and in a second area of the semiconductor region, material of the semiconductor region is removed only in the first removal step or only in the second removal step.

The first area and the second area adjoin one another in particular directly. Removal of the material of the semiconductor region can take place, for example, by a wet chemical or dry chemical process.

The method may comprise a step in which a contact is applied to the first area and the second area. In the first area an interface of the contact facing the active region is located closer to the active region than in the second area.

In other words, the contact on the side facing the semiconductor region is formed stepped so that the contact adjoins the semiconductor region at different heights of the semiconductor region. The first area and the second area can in particular directly adjoin different sublayers of the semiconductor region and electrically contact at least one of these sublayers.

For example, a step exists between the first area and the second area with a step height of 0.5 µm to 5 µm, in particular 1 µm to 3 µm.

The semiconductor region may be provided on an active region and may have a current-spreading layer and a covering layer, wherein the current-spreading layer is arranged between the active region and the covering layer.

In particular, the second area can form after the first removal step and after the second removal step a barrier region, in which the covering layer is exposed. In the first area, the current-spreading layer can be exposed in a terminal area.

In the following formation of the contact, the contact can adjoin the covering layer in the barrier region and adjoin the current-spreading layer in the terminal area.

Material may only be removed in the second removal step in the second area. At the time of the second removal step, material of the semiconductor region has thus already been removed in the first area.

A plasma etching process may be carried out in the first removal step and in the second removal step. Such a process is especially suitable for removing material of the semiconductor region such that the current-spreading layer is reached without the active region becoming damaged.

Furthermore, I provide a method of producing an optoelectronic semiconductor device with a contact, wherein the contact is formed in particular as described above.

The semiconductor region may be deposited on a growth substrate and the growth substrate may be removed prior to the removal steps. In particular, the semiconductor region can be arranged following deposition between the growth substrate and the active region.

Alternatively, however, it is also possible that the semiconductor region remains on the growth substrate. For example, the semiconductor region can be arranged on the side of the active region facing away from the substrate. The radiation passage surface is thus arranged on the side of the semiconductor region facing away from the growth substrate.

Patterning may be formed on the semiconductor region, wherein the area and the further area are omitted from the patterning. Even after formation of the patterning, the area and the further area are thus formed comparatively flat. Starting out from such a flat surface, the current-spreading layer can be electrically contacted particularly reliably by the two-stage removal process. In particular, even with a current-spreading layer arranged comparatively close to the active region, the risk of the active region becoming damaged on exposure of the current-spreading layer can be avoided.

The method described is especially suitable for producing the optoelectronic semiconductor device described further above. Features cited in connection with the method can therefore be used also for the semiconductor device and vice versa.

Further configurations and developments result from the examples described below in connection with the figures.

Identical and similar elements or elements having the same effect are provided with the same reference signs in the figures. The figures and the size ratios of the elements shown in the figures in relation to one another should not be regarded as being to scale. On the contrary, individual elements, especially layer thicknesses, may be represented in an exaggeratedly large manner for better visualization and/or understanding.

Figure 1:
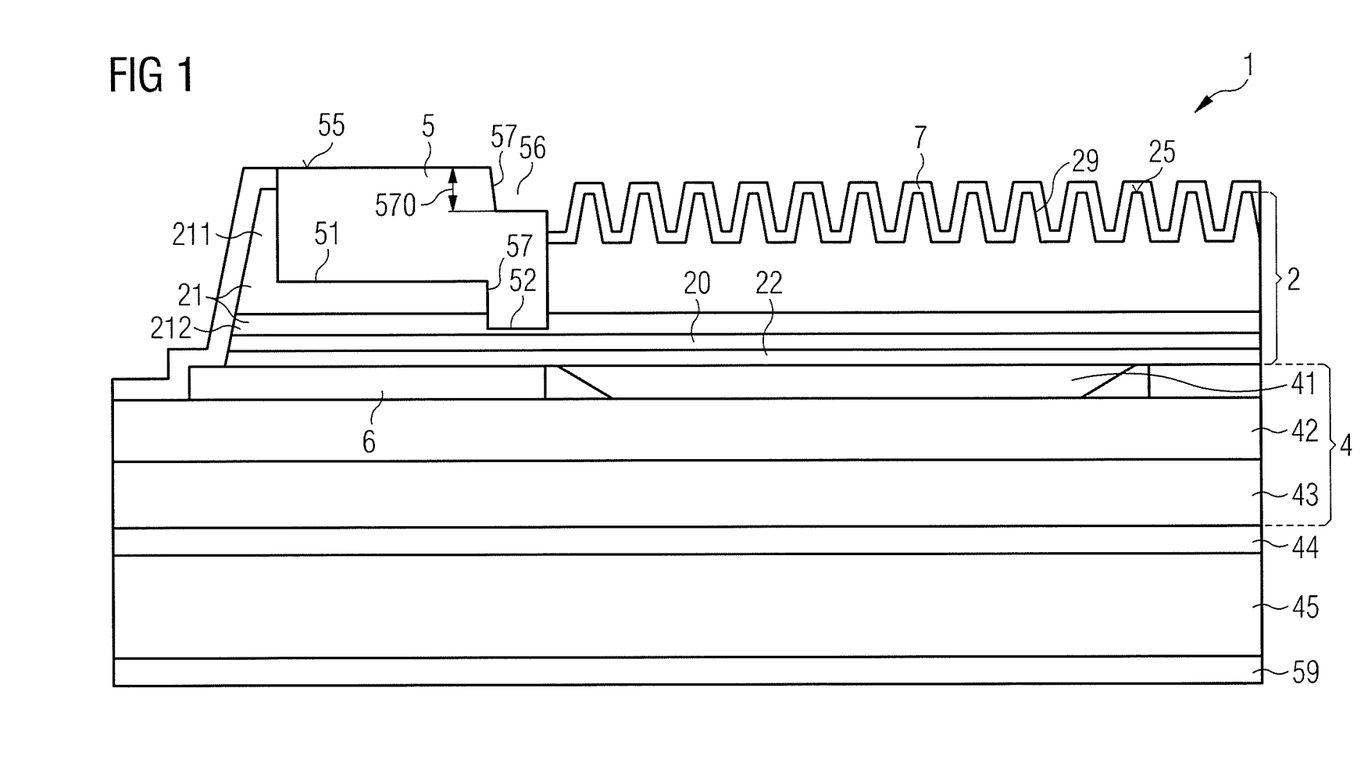
FIG. 1 shows a schematic sectional view of an example of my optoelectronic semiconductor device.

An example of a semiconductor device is shown in a schematic sectional view in FIG. 1. The semiconductor device 1 is formed as an example as a radiation emitter in the form of a light-emitting diode. Deviating from this, however, the semiconductor device can also be a radiation receiver to detect radiation.

The optoelectronic semiconductor device 1 has a semiconductor body 2. The semiconductor body 2 comprises an in particular epitaxially deposited semiconductor layer sequence that forms the semiconductor body. The semiconductor body has a semiconductor region 21 and a further semiconductor region 22 that differ from one another with regard to the charge type. For example, the semiconductor region 21 is n-type conductive in a vertical direction at least in places and the further semiconductor region 22 is p-type conductive in a vertical direction at least in places, or vice versa. Arranged between the semiconductor region and the further semiconductor region is an active region 20 provided to generate radiation.

The semiconductor region 21 further comprises a covering layer 211 and a current-spreading layer 212 arranged between the covering layer and the active region 20.

The current-spreading layer can adjoin the active region 20 or be spaced at a distance from the active region. The current-spreading layer is preferably arranged at most at a distance of 100 nm from the active region. The current-spreading layer is thus located especially close to the active region.

The semiconductor device 1 further comprises a contact 5. On the side facing the active region 20, the contact 5 has a barrier region 51 in which the contact adjoins the covering layer 211. The barrier region 51 is located closer to the active region 20 than a radiation passage surface 25 formed by the covering layer 211 on the side of the semiconductor region 21 facing away from the active region 20.

The contact 5 further has a terminal area 52 in which the contact adjoins the current-spreading layer 212.

A surface of the barrier region 51 is preferably at least twice as large as a surface of the terminal area 52, especially preferably at least five times as large. A large-scale charge carrier injection directly beneath the contact 5 can thus be avoided in a simple and reliable manner.

The charge carrier concentration of the current-spreading layer 212 is preferably higher than the charge carrier concentration of the covering layer 211, for example, at least ten times as high so that by applying an electrical voltage between the contact 5 and a further contact 59, charge carriers are injected almost exclusively via the terminal area 52 into the semiconductor region 21. By way of the comparatively low doping concentration of the covering layer 211 it can be avoided that too great a proportion of charge carriers is injected into the active region 20 in a vertical direction directly beneath the contact. On the whole, the charge carrier injection thereby takes place mainly in areas of the active region 20 in which the radiation passage surface 25 is not obscured by the contact 5.

On the side facing away from the barrier region 51, the contact 5 has a contact surface 55 for external electrical contacting, for example, by a wire bond. The contact 5 further has a recess 56 over the terminal area 52 on the side facing away from the active region 20. In other words, the surface of the contact 5 that is accessible for external contacting is not formed flat. For example, located between the contact surface 55 and the recess 56 and, correspondingly also between the barrier region 51 and the terminal area 52, is a step 57 with a step height 570 of 0.5 μm to 5 μm, in particular 1 μm to 3 μm.

The radiation passage surface 25 further has a patterning 29 provided to increase outcoupling efficiency of the radiation generated in the active region. The barrier region 51 and the terminal area 52 are formed flat in contrast to this. Reflectivity of the contact 5 in the barrier region and the terminal area can be increased and absorption losses at the contact reduced by this.

On the side of the semiconductor region 21 facing away from the active region 20, furthermore, a passivation layer 7 is arranged.

In the example shown, the semiconductor device 1 is formed as a thin film semiconductor device in which a growth substrate for the epitaxial deposition of the semiconductor layers of the semiconductor body 2 is removed and a carrier 45 different from the growth substrate mechanically stabilizes the semiconductor layer sequence. The semiconductor body 2 is attached to the carrier 45 by a bonding layer 43.

Deviating from this, however, the contacting described can also be used for a semiconductor device in which the growth substrate itself forms the carrier. In this case, a bonding layer is not required. The semiconductor region 21 is then arranged on the side of the active region 20 facing away from the growth substrate.

The semiconductor device 1 further comprises a mirror layer 41, via which the electrical contacting of the further semiconductor region 22 takes place. The mirror layer 41, a further layer 42 and the bonding layer 43 form sublayers of a connection layer 4, via which the further semiconductor region 22 is connected electrically conductively to a metallization 44 on the carrier 45. In operation of the semiconductor device the charge carrier injection can take place via the further contact 59 arranged on the side of the carrier 45 facing away from the semiconductor body 2. An insulation layer 6 is arranged on areas of the further semiconductor region 22 not provided for the electrical contacting of the further semiconductor region, for example, beneath the contact 5.

The insulation layer 6 and the passivation layer 7 expediently contain a dielectric material, for example, an oxide, for instance silicon oxide, or a nitride, for example, silicon nitride.

The sublayers of the connection layer 4 can each contain a metal. For example, the terminal area contains one or more materials selected from the group titanium, platinum, nickel, gold, tungsten and tin. For the mirror layer, a material with a high reflectivity for the radiation to be generated in the active region is particularly suitable. For example, silver is characterized by a high reflectivity in the visible spectral range. Individual sublayers of the connection layer 4 can also comprise a TCO material, for instance ZnO or ITO.

In FIGS. 2A to 2G, a method of producing a semiconductor device formed as described in connection with FIG. 1, is shown with reference to intermediate steps shown respectively schematically in a sectional view. The intermediate steps represented in FIGS. 2D to 2G here show the method steps of producing an electrical contact for a semiconductor region.

Figure 2A:
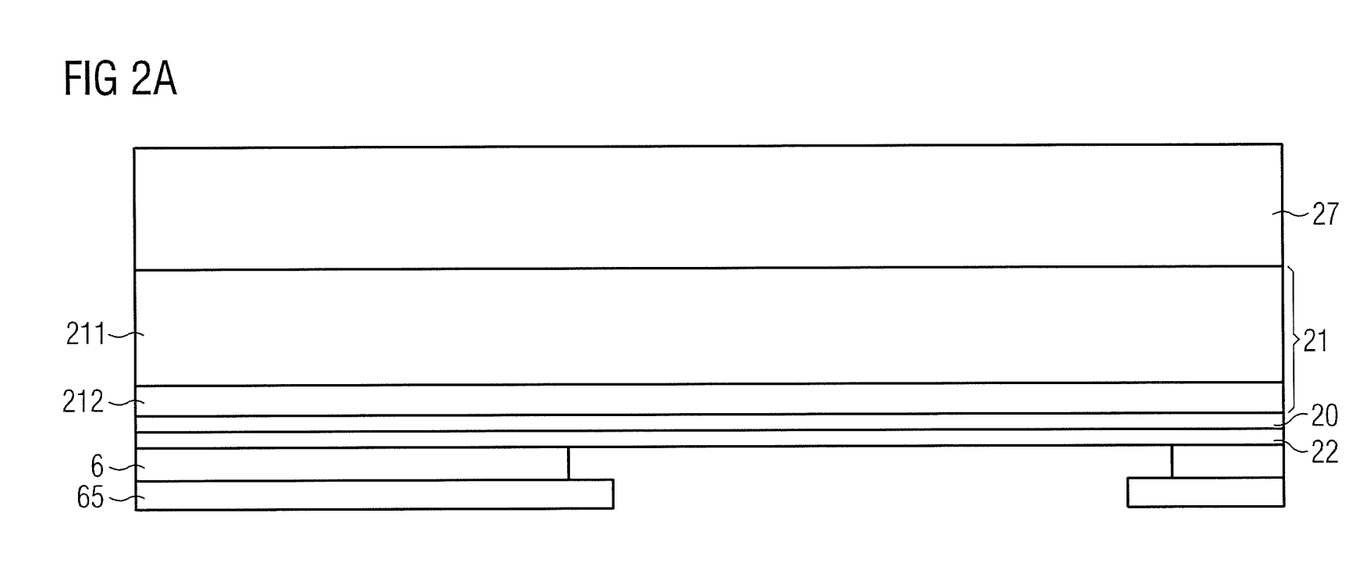
FIGS. 2A to 2G show an example of a method of producing a semiconductor device, wherein the method steps of producing a contact are described with reference to the intermediate steps shown in FIGS. 2E to 2G.

As shown in FIG. 2A, a semiconductor region 21 with an active region and a further semiconductor region 22 is provided, for example, on a growth substrate 27. In the figures, a section is shown in each case, from which precisely one semiconductor device arises. During production, however, a plurality of semiconductor devices is produced simultaneously in a wafer composite and the semiconductor devices arise from the wafer composite by a singulation step.

On the further semiconductor region 22, an insulation layer 6 is applied in places, for example, by atomic layer deposition (ALD) and/or by vapor deposition or sputtering.

Figure 2B:
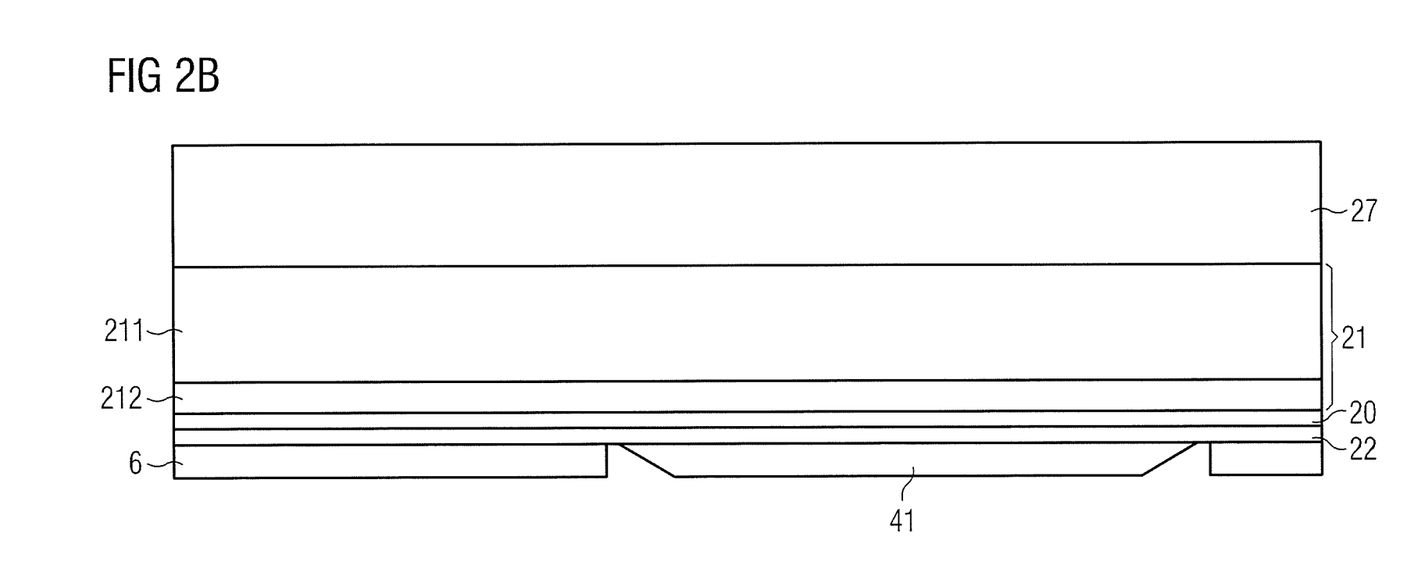

Furthermore, a masking layer 65 is applied. In areas not covered by the masking layer 65, a mirror layer 41 is applied, as shown in FIG. 2B, to the further semiconductor region 22, for example, by vapor deposition and/or sputtering. Then a further layer 42 and a bonding layer 43 of the connection layer 4 are applied (FIG. 2C), wherein the further layer and the bonding layer 43 also overlay the insulation layer 6. The further layer 42 and the bonding layer 43 can be applied in particular all over.

Figure 2C:
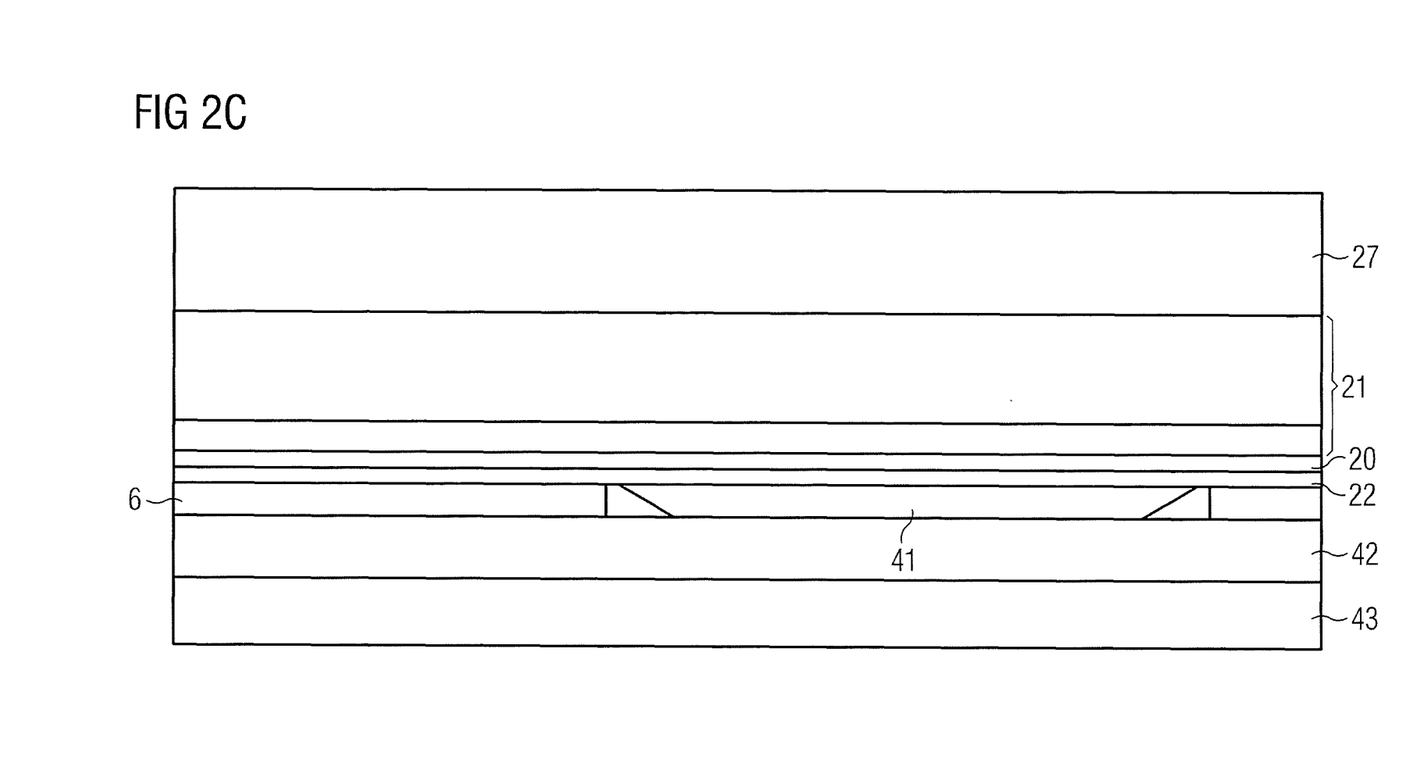

A carrier 45 is then applied that mechanically stabilizes the semiconductor region 21 and the further semiconductor region 22. The growth substrate 27 can be removed, for example, by a laser lift-off (LLO) process.

Figure 2D:
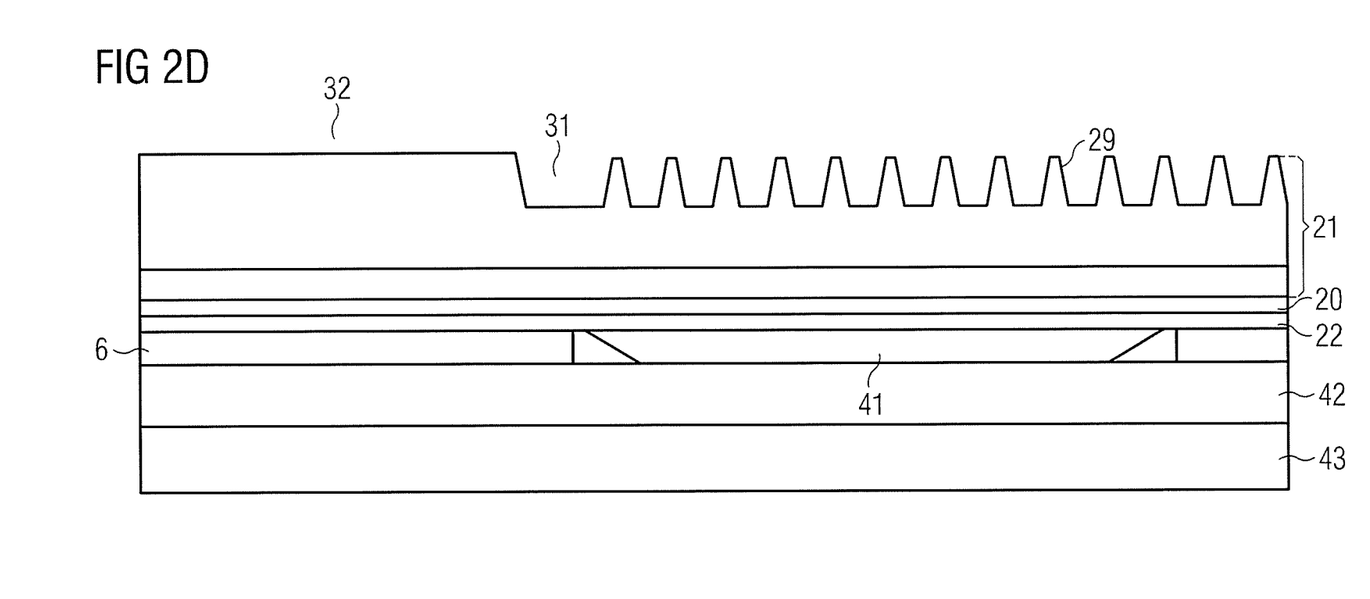
Figure 2E:
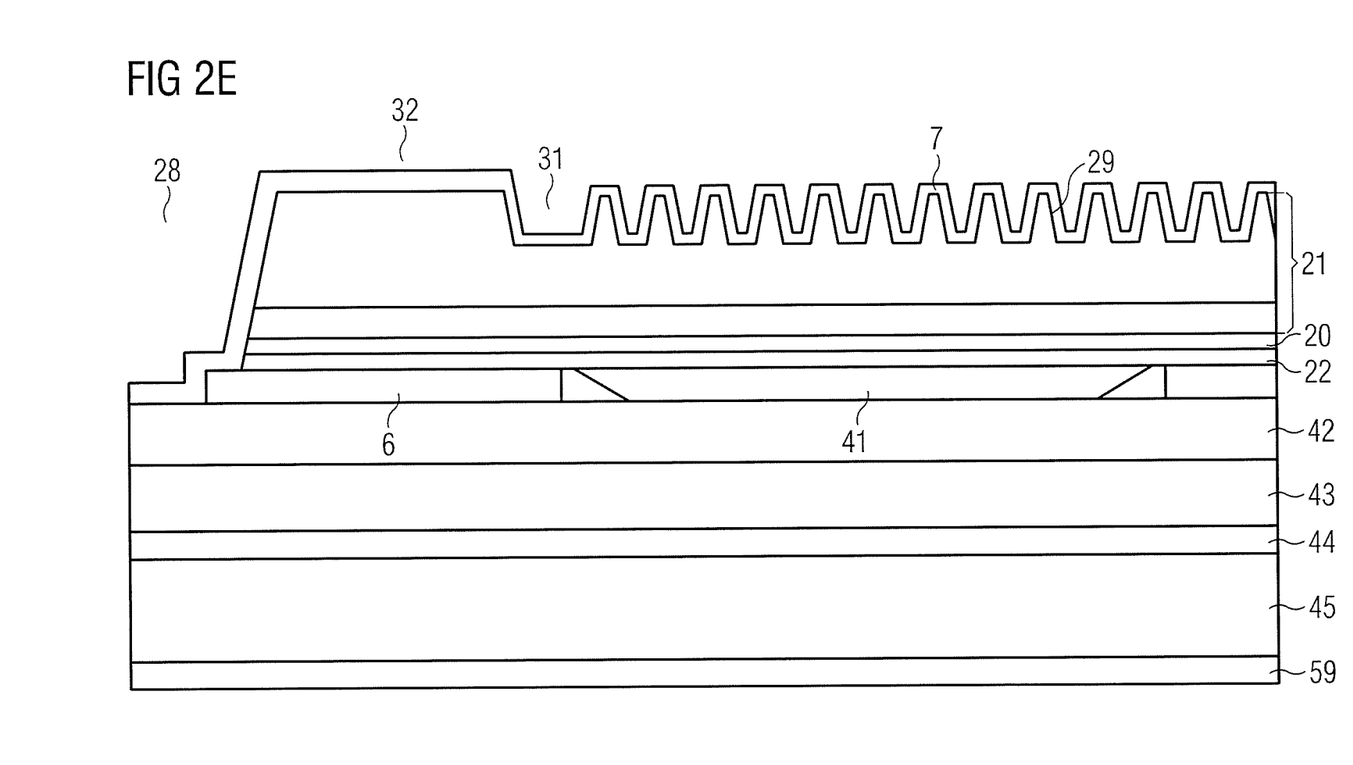

As shown in FIG. 2D, a semiconductor region 21 is thus provided for which an electrical contacting can now be formed.

For this purpose, material of the first semiconductor region 21 is removed in a first removal step in a first area 31. No material removal takes place, on the other hand, in the second area 32 adjoining the first area. Furthermore, patterning 29 can be formed on a radiation passage surface 25 of the semiconductor region 21.

The first area 31 and the second area 32 are omitted when forming the patterning, however, so that the first area 31 and the second area 32 are flat.

In a following step (FIG. 2E) separating trenches 28 are formed between the subsequent semiconductor devices, which trenches define the individual semiconductor bodies of the semiconductor devices. A passivation layer 7 is applied to the semiconductor region 21.

Figure 2F:
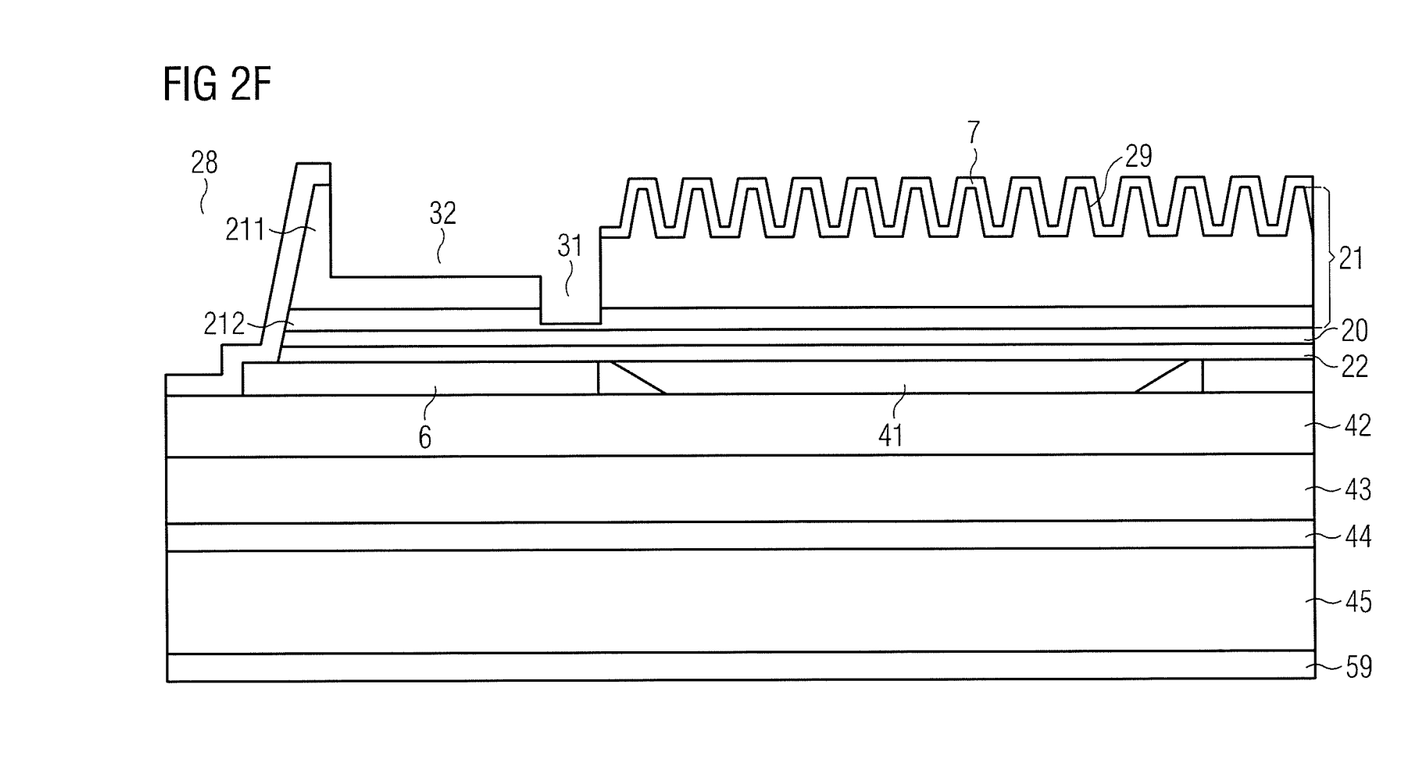

In a second removal step, material of the semiconductor region 21 is then removed both in the first area 31 and in the second area 32. In the first area 31 the current spreading layer 212 is exposed. In the second area 32, on the other hand, the covering layer 211 is exposed (FIG. 2F).

Figure 2G:
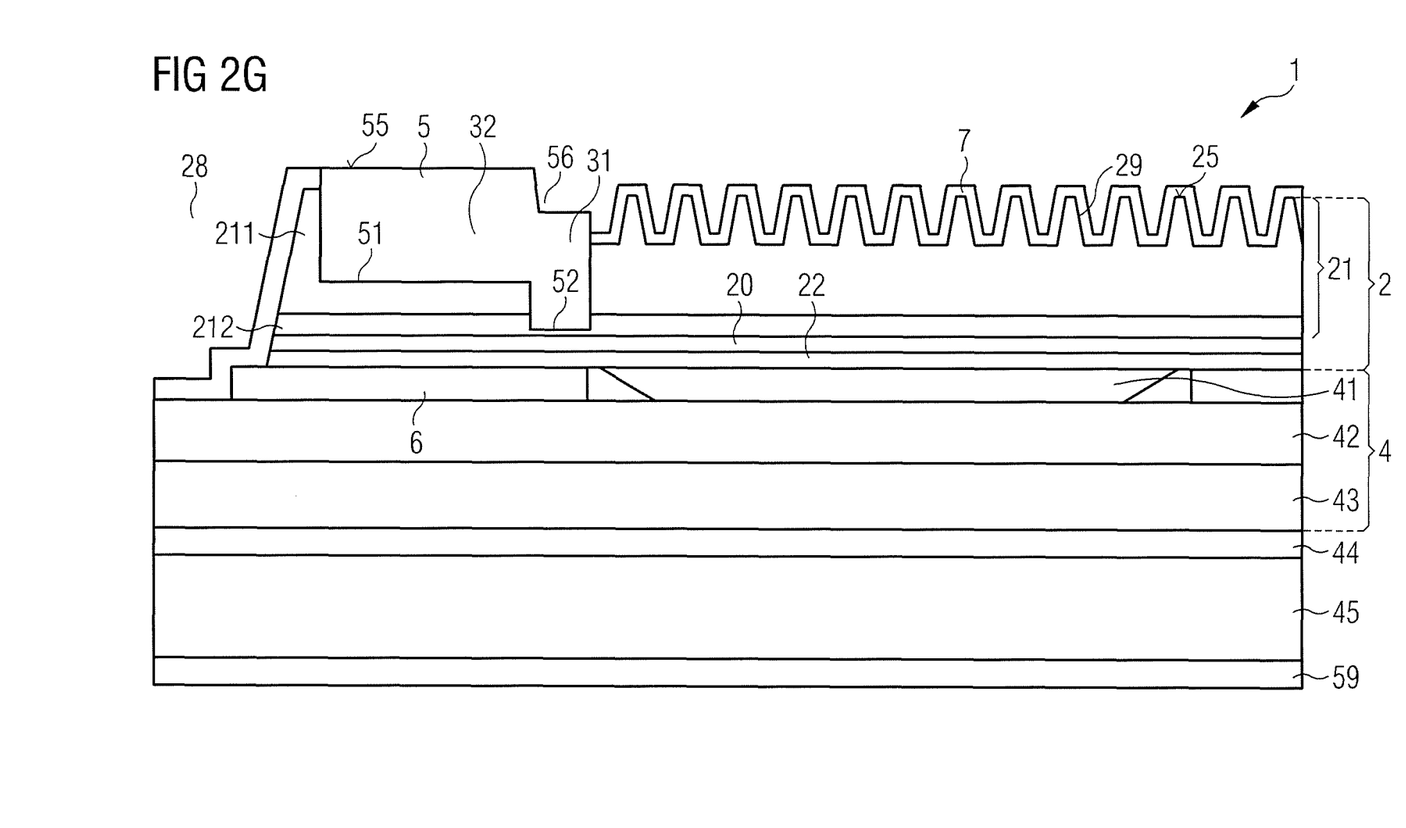

By subsequent application of a contact 5 to the first area 31 and the second area 32, a contact is created having a terminal area 52 in the first area 31 and a barrier region 51 in the second area 32 (FIG. 2G).

By the two-stage material removal for the exposure of the current-spreading layer 212, in particular in connection with the omission of the first area 31 and the second area 32 when forming the patterning 29, contacting of the current-spreading layer 212 lying comparatively close to the active region 20 can be achieved in a particularly reliable manner without the active region 20 becoming damaged by the material removal. In addition, a direct vertical current injection into the active region beneath the contact is avoided by the barrier region 51 arranged beneath the contact surface 55 so that the efficiency of the semiconductor device is increased.

This application claims priority of DE 10 2015 102 857.3, the subject matter of which is incorporated herein by reference.

My devices and methods are not limited by the description with reference to the examples. On the contrary, this disclosure comprises every new feature as well as every combination of features, which includes in particular every combination of features in the appended claims, even if the feature or combination is not itself explicitly specified in the claims or examples.

The invention claimed is:

1. An optoelectronic semiconductor device comprising a semiconductor body having a semiconductor region and an active region, wherein
    the semiconductor region has a covering layer forming a radiation passage surface of the semiconductor body on a side facing away from the active region,
    the semiconductor region has a current-spreading layer arranged between the covering layer and the active region;
    the semiconductor device has a contact for the electrical contacting of the semiconductor region;
    the contact adjoins the current-spreading layer in a terminal area;
    the contact adjoins the covering layer in a barrier region; and
    the barrier region runs parallel to the active region and is arranged closer to the active region than the radiation passage surface.

2. The semiconductor device according to claim 1, wherein the radiation passage surface has a patterning in areas and the terminal area is flat.

3. The semiconductor device according to claim 1, wherein a doping concentration of the current-spreading layer is at least ten times as high as a doping concentration of the covering layer.

4. The semiconductor device according to claim 1, wherein the current-spreading layer is spaced at a distance of at most 100 nm from the active region.

5. The semiconductor device according to claim 1, wherein a surface of the barrier region is at least twice as large as a surface of the terminal area.

* * * * *